United States Patent
Yun et al.

(10) Patent No.: US 8,946,094 B2
(45) Date of Patent: Feb. 3, 2015

(54) METHOD OF FABRICATING A GRAPHENE ELECTRONIC DEVICE

(71) Applicant: Electronics and Telecommunications Research Institute, Daejeon (KR)

(72) Inventors: Yong Ju Yun, Daejeon (KR); Kibong Song, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/867,535

(22) Filed: Apr. 22, 2013

(65) Prior Publication Data

US 2013/0313523 A1    Nov. 28, 2013

(30) Foreign Application Priority Data

May 22, 2012  (KR) .................. 10-2012-0054437
Aug. 8, 2012  (KR) .................. 10-2012-0086796

(51) Int. Cl.
| | | |
|---|---|---|
| *H01L 21/31* | (2006.01) | |
| *H01L 21/02* | (2006.01) | |
| *H01L 29/16* | (2006.01) | |
| *H01L 29/778* | (2006.01) | |
| *H01L 29/417* | (2006.01) | |
| *H01L 29/06* | (2006.01) | |

(52) U.S. Cl.
CPC ...... *H01L 21/02527* (2013.01); *H01L 29/1606* (2013.01); *H01L 21/02422* (2013.01); *H01L 21/02601* (2013.01); *H01L 21/02628* (2013.01); *H01L 21/02639* (2013.01); *H01L 21/02664* (2013.01); *H01L 29/778* (2013.01); *H01L 29/41758* (2013.01); *H01L 29/0673* (2013.01)
USPC .................................. 438/780; 257/E21.041

(58) Field of Classification Search
USPC .................. 438/106, 492, 497, 500, 780; 257/E21.005, E21.041, E21.049
See application file for complete search history.

(56) References Cited

U.S. PATENT DOCUMENTS

| | | | |
|---|---|---|---|
| 2010/0130005 A1* | 5/2010 | Lee et al. .................. | 438/652 |
| 2012/0220053 A1* | 8/2012 | Lee et al. .................. | 436/501 |
| 2012/0241069 A1* | 9/2012 | Hofmann et al. .......... | 156/60 |

FOREIGN PATENT DOCUMENTS

| | | |
|---|---|---|
| KR | 10-2010-0105179 A | 9/2010 |
| KR | 10-1074027 B1 | 10/2011 |

OTHER PUBLICATIONS

Sung Myung et al., "Graphene-Encapsulated Nanoparticle-Based Biosensor for the Selective Detection of Cancer Biomarkers", Advanced Materials, May 17, 2011, pp. 2221-2225, vol. 23, Issue 19.

(Continued)

*Primary Examiner* — Quoc Hoang
(74) *Attorney, Agent, or Firm* — Rabin & Berdo, P.C.

(57) ABSTRACT

A method of fabricating a graphene electronic device includes (a) forming a first electrode and a second electrode spaced apart from each other, on a substrate; (b) forming supporting patterns on the first electrode and the second electrode; (c) coating the supporting patterns with graphene-oxide-containing solution to form composite patterns; and (d) separating the supporting patterns from the composite patterns. The step of forming supporting patterns may expose end portions of the first and second electrodes and the substrate between the end portions and be accomplished by providing a mask on the first and second electrodes; and electrospinning a polymer solution on the first and second electrodes with the mask. The supporting patterns may be composed of polymer fibers.

20 Claims, 13 Drawing Sheets

(56) References Cited

OTHER PUBLICATIONS

Yuan Liu et al., "Plasmon resonance enhanced multicolor photodetection by graphene", Nature Communication, Dec. 6, 2011, pp. 1-7, vol. 2, No. 579.

Weiwei Li et al., "Reduced Graphene Oxide Electrically Contacted Graphene Sensor for Highly Sensitive Nitric Oxide Detection", ACS NANO, Aug. 11, 2011, pp. 6955-6961, vol. 5, No. 9.

Leonhard Prechtel et al., "Time-resolved ultrafast photocurrents and terahertz generation in freely suspended graphene", Nature Communication, Jan. 31, 2012, pp. 1-7, vol. 3, No. 646.

* cited by examiner

METHOD OF FABRICATING A GRAPHENE ELECTRONIC DEVICE

CROSS-REFERENCE TO RELATED APPLICATIONS

This U.S. non-provisional patent application claims priority under 35 U.S.C. §119 to Korean Patent Application Nos. 10-2012-0054437 and 10-2012-0086796, filed on May 22, 2012 and Aug. 8, 2012, respectively, in the Korean Intellectual Property Office, the entire contents of which are hereby incorporated by reference.

BACKGROUND OF THE INVENTION

Example embodiments of the inventive concept relate to an electronic device and a method of fabricating the same, and in particular, to a graphene electronic device and a method of fabricating the same.

Graphene a substance composed of pure carbon, with atoms two-dimensionally arranged in a regular hexagonal pattern similar to graphite. Graphene can be obtained from graphite crystals, for example, using an adhesive tape (e.g., a scotch tape). Graphene exhibits excellent electric characteristics, such as high conductivity of $1 \times 10^{-6}$ $\Omega$cm and high electron mobility, as well as excellent material characteristics, such as a large surface area of 2650 $m^2/g$, that is larger than two times that of active carbon, a high elasticity modulus of 1 TPa, and high chemical stability. In addition, after seeing the recent report about graphene as an antibacterial material, graphene is in the spotlight. In this sense, there are many researches to use graphene in fields of display, lithium-ion cell, capacitor electrode, Environmental Filter, and biotechnology.

SUMMARY

Example embodiments of the inventive concept provide a method capable of easily fabricating a graphene electronic device with a large area graphene channel.

Other example embodiments of the inventive concept provide a graphene electronic device with a large area graphene channel.

According to example embodiments of the inventive concepts, a method of fabricating a graphene electronic device may include forming a first electrode and a second electrode spaced apart from each other, on a substrate, forming supporting patterns on the first electrode and the second electrode, coating the supporting patterns with graphene-oxide-containing solution to form composite patterns, and separating the supporting patterns from the composite patterns.

In example embodiments, the supporting patterns may be formed to connect the first electrode to the second electrode.

In example embodiments, the supporting patterns include polymer fibers.

In example embodiments, the forming of the supporting patterns may include providing a mask on the first and second electrodes, and electrospinning a polymer solution on the first and second electrodes with the mask. The mask may be formed to expose end portions of the first and second electrodes and the substrate between the end portions.

In example embodiments, the supporting patterns may be formed spaced apart from the substrate to connect the end portions of the first and second electrodes to each other.

In example embodiments, the forming of the supporting patterns may further include using ammonia solution or sodium hydroxide solution to make the supporting patterns insoluble.

In example embodiments, the coating of the supporting patterns with graphene-oxide-containing solution may be performed in such a way that graphene oxide in the graphene-oxide-containing solution may be self-assembled with the supporting patterns.

In example embodiments, the separating of the supporting patterns from the composite patterns may include thermally treating or chemically dissolving an electronic device including the composite patterns.

In example embodiments, the chemical dissolving may be performed using acidic solvent.

In example embodiments, the coating of the supporting patterns with graphene-oxide-containing solution may include dipping the supporting patterns into the graphene-oxide-containing solution to form graphene oxide composite patterns, and reducing the graphene oxide composite patterns to graphene composite patterns.

In example embodiments, the reducing of the graphene oxide composite patterns to the graphene composite patterns may be performed using a thermal, optical, or chemical method.

According to example embodiments of the inventive concepts, a graphene electronic device may include a substrate, a first electrode and a second electrode provided on the substrate and spaced apart from each other, and graphene channels connecting the first electrode with the second electrode. Each of the graphene channels may be separated from the substrate to have a cylindrical structure. In addition, each of the graphene channels may include graphene or graphene oxide and have an inner diameter of about 1 nm to about 100 μm.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
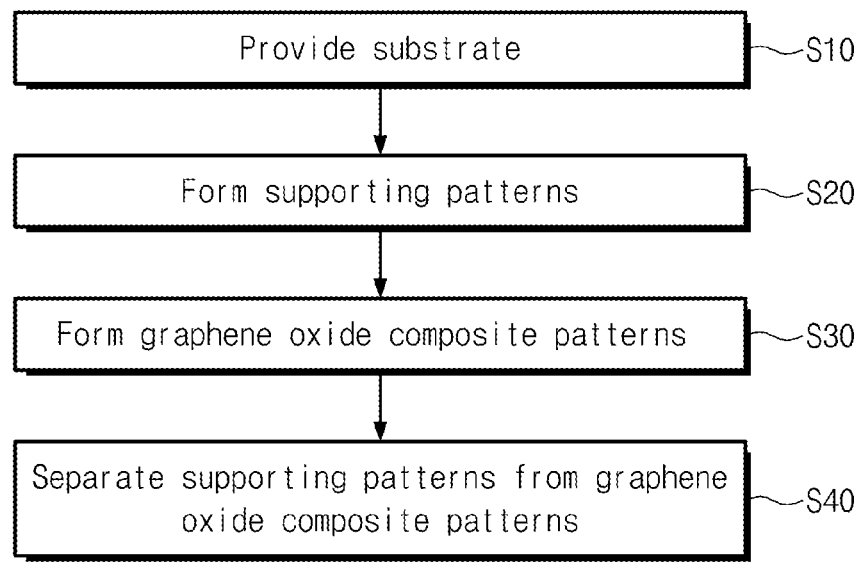
FIG. 1 is a flow chart illustrating a method of fabricating a graphene electronic device according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/ or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1 through 9C are provided to describe a method of fabricating a graphene electronic device according to example embodiments of the inventive concept. FIGS. 2A, 3A, 4A, 6A, and 9A are plan views illustrating the graphene electronic device according to example embodiments of the inventive concept, and FIGS. 2B, 3B, 4B, 6B, and 9B are sectional views taken along line A-A' of FIG. 2A, line B-B' of FIG. 3A, line C-C' of FIG. 4A, line D-D' of FIG. 6A, and line E-E of FIG. 9A, respectively.

Figure 2A:
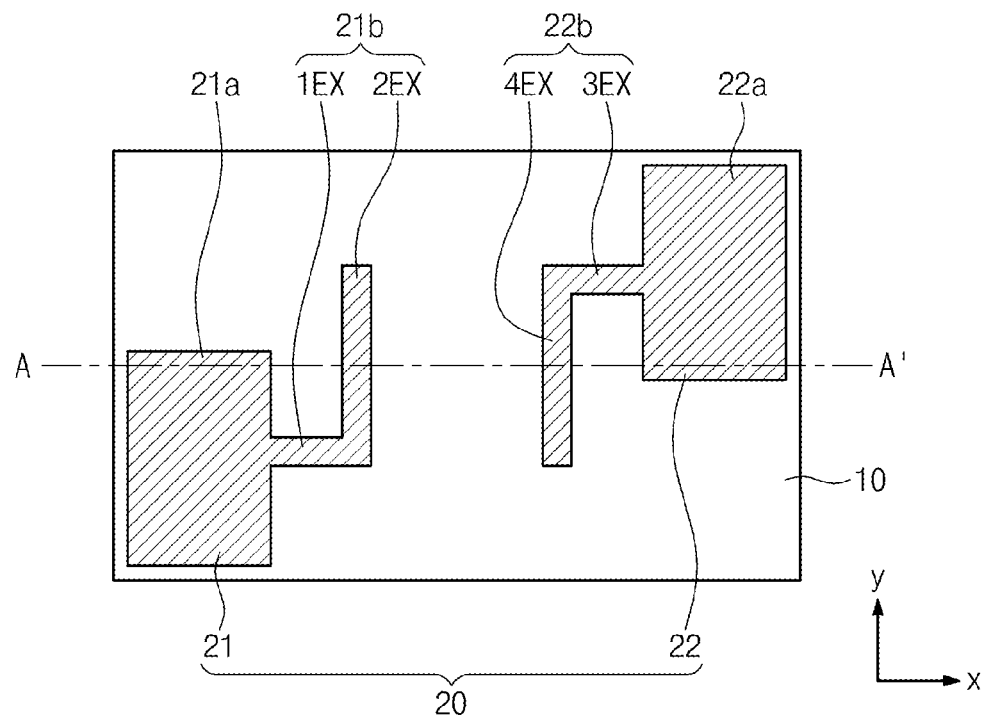
FIGS. 2A through 9C are provided to describe a graphene electronic device according to example embodiments of the inventive concept and a method of fabricating the same.
Figure 2B:
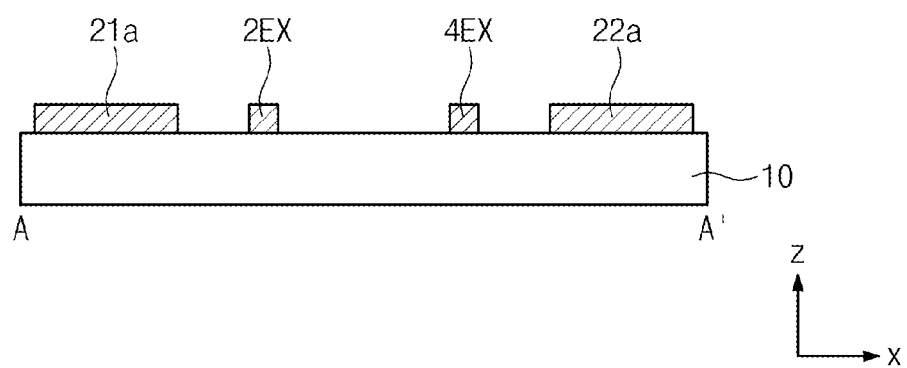
Figure 2C:
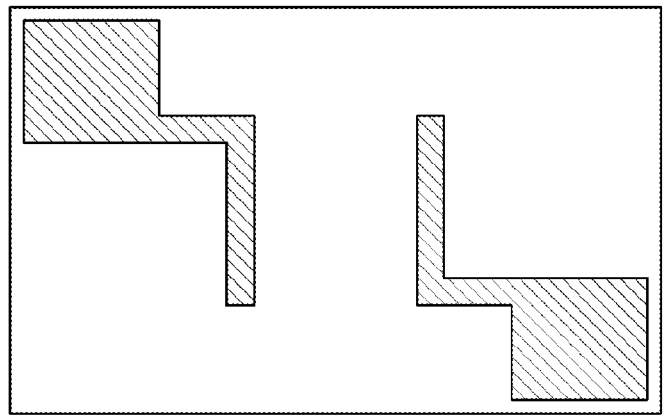
Figure 2D:
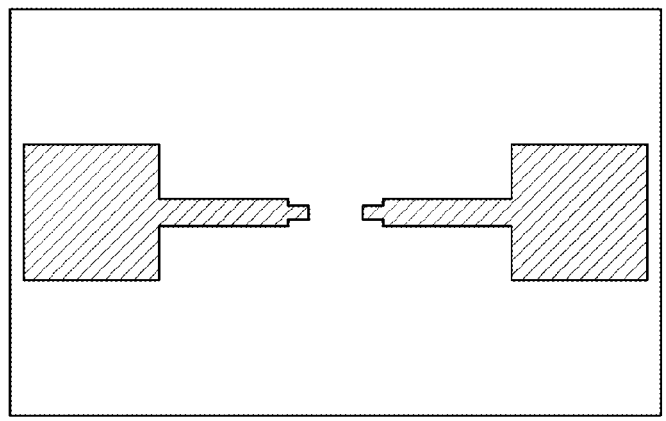
Figure 2E:
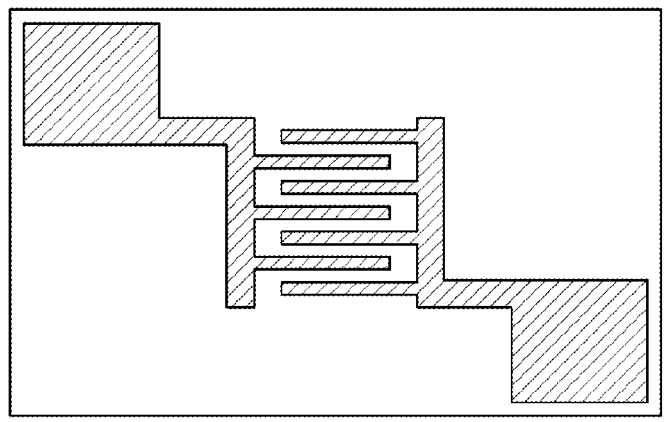

Referring to FIGS. 1, 2A, and 2B, a substrate 10 is provided (in S10). For example, the substrate 10 may be a silicon wafer. Electrodes 20 may be provided on the substrate 10. The electrodes 20 may include a first electrode 21 and a second electrode 22. The first electrode 21 and the second electrode 22 may serve as a source electrode and a drain electrode, respectively. The first electrode 21 and the second electrode 22 may be formed spaced apart from each other, on the substrate 10. The first electrode 21 may include a first electrode body 21a and a first electrode extension 21b extending from the first electrode body 21a. The first electrode extension 21b may include a first extension 1EX extending from the first electrode body 21a along an x-direction and a second extension 2EX extending from the first extension 1EX along a y-direction, where the x- and the y-directions may cross each other. The second electrode 22 may include a second electrode body 22a and a second electrode extension 22b extending from the second electrode body 22a. The second electrode extension 22b may include a third extension 3EX extending from the second electrode body 22a along an opposite direction of the x-direction and a fourth extension 4EX extending from the third extension 3EX along an opposite direction of the y-direction. The electrodes 20 may have a uniform thickness, when measured along a z-direction that is perpendicular to a top surface of the substrate 10. In example embodiments, as exemplarily shown in FIGS. 2C through 2E, the first electrode 21 and the second electrode 22 may be formed to have various structures that are modified from that shown in FIG. 2A.

The electrodes 20 may be formed using an optical lithography process or an e-beam lithography process. The first electrode 21 and the second electrode 22 may be formed a conductive material. For example, the conductive material may include at least one of gold, silver, aluminum, copper, palladium, platinum, silicon, polysilicon, conductive polymer, carbon nanotube, or graphene.

Figure 3A:
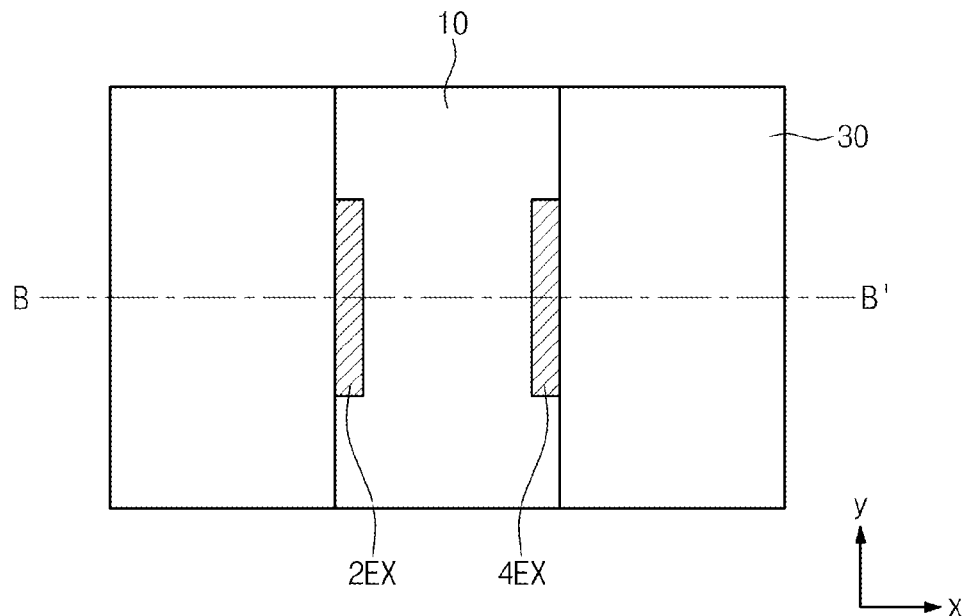
Figure 3B:
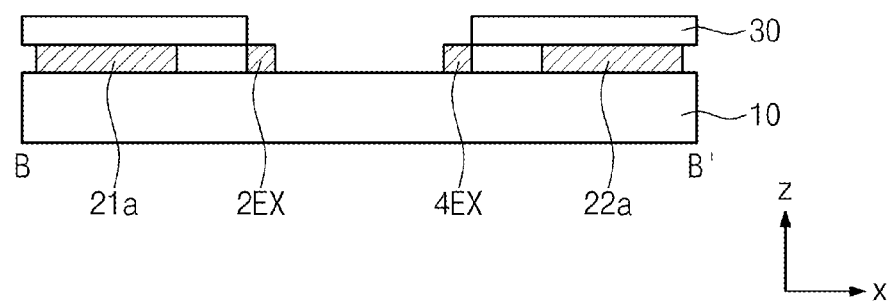

Referring to FIGS. 3A and 3B, a mask 30 may be provided on the electrodes 20. The mask 30 may be in contact with top surfaces of the electrodes 20. The mask 30 may be formed to expose the second extension 2EX of the first electrode 21, the fourth extension 4EX of the second electrode 22, and the substrate 10 between the extensions 2EX and 4EX. The mask 30 may include at least one of, for example, glass, quartz, acrylic, printed circuit board (PCB) substrate, or OHP film.

Figure 4A:
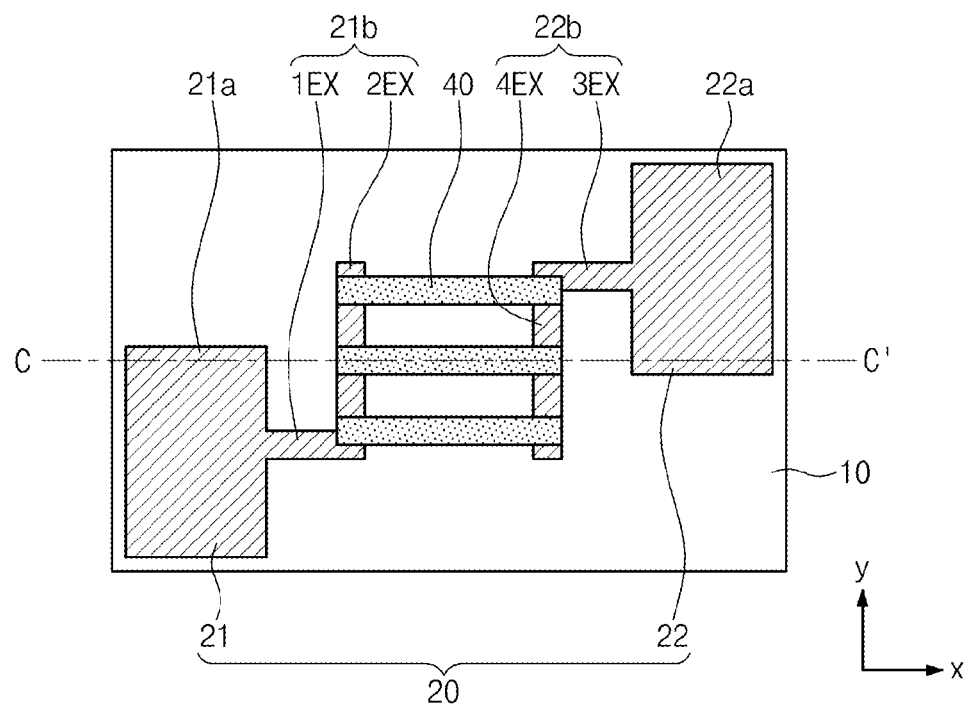
Figure 4B:
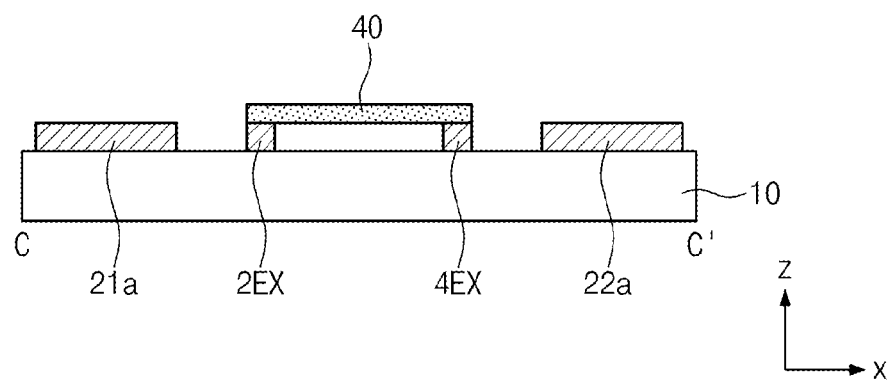

Referring to FIGS. 1, 4A, and 4B, supporting patterns 40 may be formed on the electrodes 20 (in S20). The supporting patterns 40 may be partially overlapped with the electrodes 20 and thereby connect the first electrode 21 to the second electrode 22. For example, the supporting patterns 40 may be formed vertically spaced apart from the substrate 10 to connect the second extension 2EX of the first electrode 21 to the fourth extension 4EX of the second electrode 22. In example embodiments, the supporting patterns 40 may include a polymer fiber. In example embodiments, the formation of the supporting patterns 40 may include a step of electrospinning polymer solution on the substrate 10.

The polymer solution may be provided in the form of polymer-containing solvent. The polymer provided in the solvent may include at least one of polyamide-6, polyamide-6,6, polyurehtanes, polybenzimidazole, polyacrylonitrile, polyaniline (PANI), polyvinylcarbazole, polyacrylamide (PAAm), polyimide, poly-metaphenyleneisophtalamides, poly-L-lysine, betaamyloid, collagen, fibrin, chitosan, or gelatin. The solvent may include at least one of water, ethanol, methanol, acetone, phosphate buffered saline (PBS) buffer, acetic acid ($C_2H_4O_2$), formic acid ($CH_2O_2$), hexafluoro-2-propanol (($CF_3$)$_2$CHOH), trifluoroaceticacid ($C_2HF_3O_2$), dichloromethane ($CH_2Cl_2$), acetonitrile ($C_2H_3N$), benzene ($C_6H_6$), 1-butanol ($C_4H_{10}O$), 2-butanol ($C_4H_{10}O$), 2-butanone ($C_4H_8O$), t-butyl alcohol ($C_4H_{10}O$), carbon tetrachloride ($CCl_4$), chlorobenzene ($C_6H_5Cl$), chloroform ($CHCl_3$), cyclohexane ($C_6H_{12}$), 1,2-dichloroethane ($C_2H_4Cl_2$), chlorobenzene, dichloromethane ($CH_2Cl_2$), ethyl ether ($C_4H_{10}O$), diethylene glycol ($C_4H_{10}O_3$), diglyme (diethylene glycol, dimethyl ether) ($C_6H_{14}O_3$), 1,2-dimethoxy-ethane (glyme, DME) ($C_4H_{10}O_2$), dimethylether ($C_2H_6O$), dimethyl-formamide (DMF) ($C_3H_7NO$), dimethyl sulfoxide (DMSO) ($C_2H_6OS$), dioxane ($C_4H_8O2$), ethyl acetate ($C_4H_8O_2$), ethylene glycol ($C_2H_6O_2$), glycerin ($C_3H_8O_3$), heptane ($C_7H_{16}$), hexamethylphosphoramide (HMPA) ($C_6H_{18}N_3OP$), hexamethylphosphoroustriamide (HMPT) ($C_6H_{18}N_3P$), hexane ($C_6H_{14}$), methyl t-butyl ether (MTBE) ($C_5H_{12}O$), methylene chloride ($CH_2Cl_2$), N-methyl-2-pyrrolidinone (NMP) ($CH_5H_9NO$), nitromethane ($CH_3NO_2$), pentane ($C_5H_{12}$), Petroleum ether (ligroine), 1-propanol ($C_3H_8O$), 2-propanol ($C_3H_8O$), pyridine ($C_5H_5N$), tetrahydrofuran (THF) ($C_4H_8O$), toluene ($C_7H_8$), triethyl amine ($C_6H_{15}N$), o-xylene ($C_8H_{10}$), m-xylene ($C_8H_{10}$), or p-xylene ($C_8H_{10}$). In example embodiments, the polymer solution may be provided to have a concentration of about 0.1 to 50 wt % (weight percent).

Figure 5:
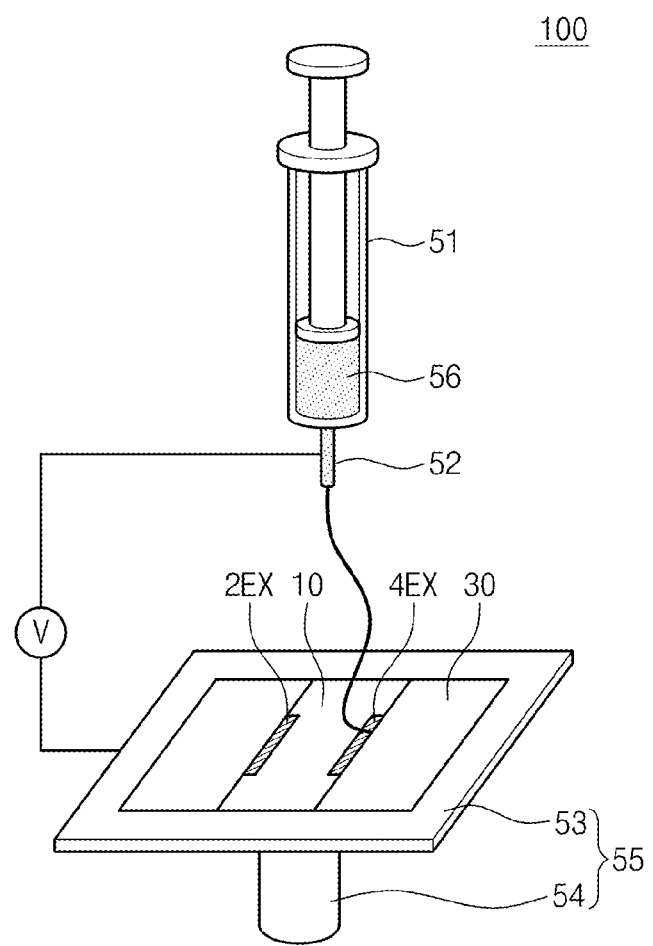

The supporting patterns 40 may be formed using an electrospinning apparatus 100 shown in FIG. 5. For example, the electrospinning apparatus 100 may include a current collector 55. The current collector 55 may include a first supporting part 54 and a second supporting part 53 on the first supporting part 54. The current collector 55 may include an insulating material. In example embodiments, the insulating material may include at least one of glass, quartz, acrylic, OHP film, polyethylene terephthalate (PET), polyethylene naphthalate (PEN), PES, PEEK, polyimide (PI), polynorbonene, polyarylate, polycarbonate (PC), PAR, polydimethylsiloxane (PDMS), or non-woven fabrics. The substrate 10 with the mask 30 (of FIGS. 3A and 3B) may be provided on the second supporting part 53. The mask 30 may expose the second extension 2EX of the first electrode 21, the fourth extension 4EX of the second electrode 22, and the substrate 10 between the extensions 2EX and 4EX. The mask 30 may prevent the supporting patterns 40 from being formed beyond the second extension 2EX of the first electrode 21 and the fourth extension 4EX of the second electrode 22. A polymer solution 56 may be supplied into a cylinder 51 and be electrospun onto a portion of the substrate 10, which is exposed by the mask 30, through a nozzle 52 of the cylinder 51. The nozzle 52 may be configured to be a single mode. For example, the nozzle 52 may be configured to have a single hole. In other embodiments, the nozzle 52 may be configured to be a multimode. For example, the nozzle 52 may be configured to have two or more holes. In example embodiments, the nozzle 52 may be provided to be a dual mode or have two holes including a first hole and a ring-shaped second hole surrounding the first hole. A specific voltage may be applied between the nozzle 52 and the electrodes 20. In example embodiments, a diameter of the supporting pattern may be controlled by adjusting the voltage applied between the nozzle 52 and the electrodes 20. In example embodiments, the supporting patterns may have a diameter ranging from about 1 nm to 100 μm. The supporting patterns 40 may be formed to have various shapes, such as a single line shape or mesh shape, depending on a shape of the electrodes 20 provided on the substrate 10. For example, the supporting patterns 40 may include a plurality of supporting patterns that connect the second extension 2EX of the first electrode to the fourth extension 4EX of the second electrode, as shown in FIGS. 4A and 4B and are provided spaced apart from the substrate 10. The mask 30 may be removed after the formation of the supporting patterns 40, as shown in FIGS. 4A and 4B. The supporting patterns 40 may be neutralized using ammonia solution or sodium hydroxide solution (NaOH), thereby having insolubility.

Figure 6A:
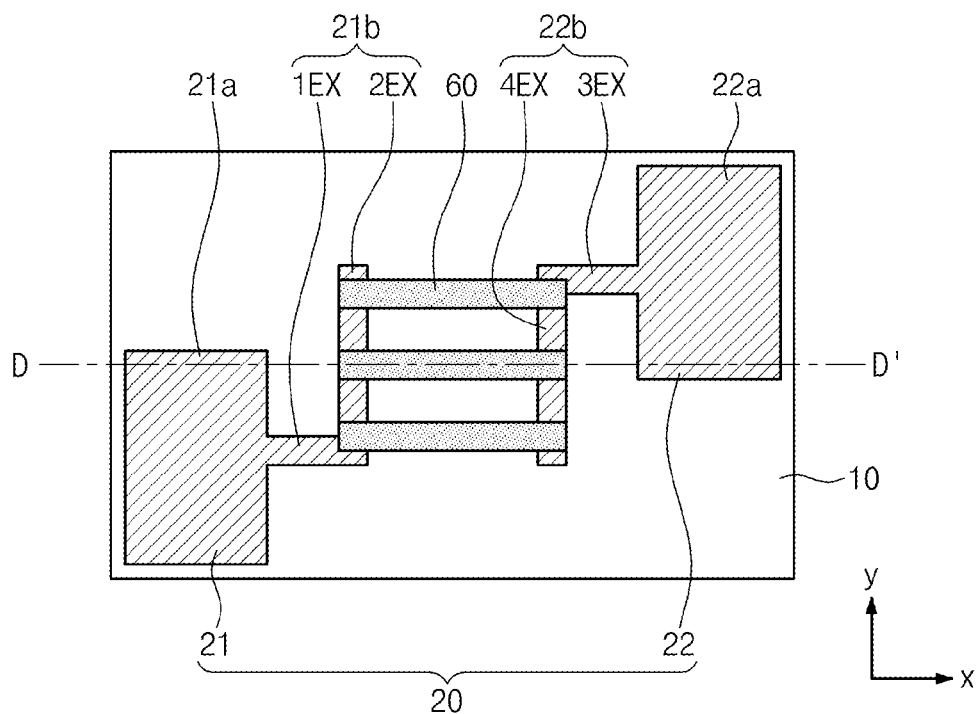
Figure 6B:
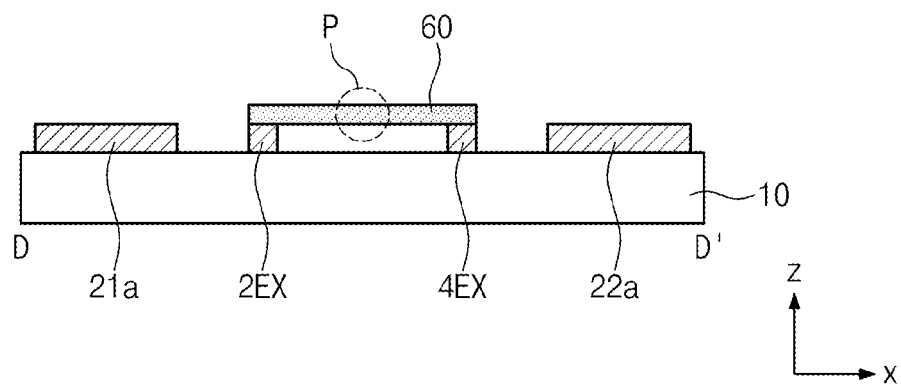
Figure 6C:
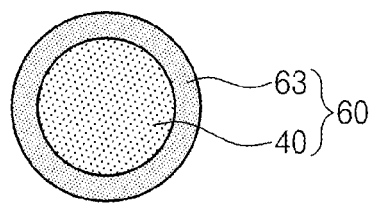

Referring to FIGS. 1 and 6A through 6C, graphene oxide composite patterns 60 may be formed (in S30). Here, FIG. 6C is a sectional view of a portion P of FIG. 6B. The graphene oxide composite patterns 60 may be formed on surfaces of the electrodes 20 to connect the first electrode 21 to the second electrode 22. For example, the graphene oxide composite patterns 60 may connect the second extension 2EX of the first electrode 21 to the fourth extension 4EX of the second electrode 22 and be spaced apart from the substrate 10. Each of the graphene oxide composite patterns 60 may consist of the supporting pattern 40 and a graphene oxide structure 63 surrounding the supporting pattern 40.

Figure 7:
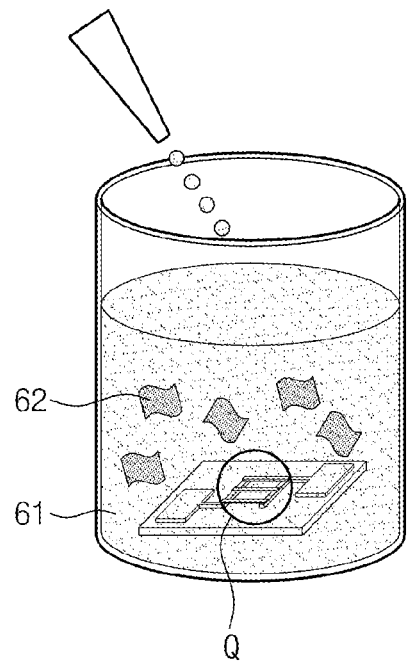
Figure 8:
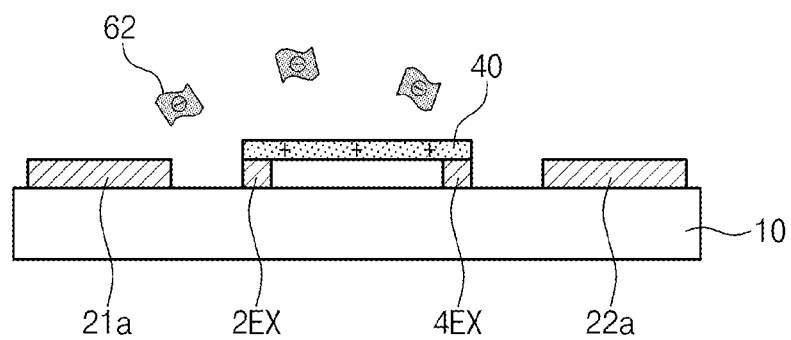

The formation of the graphene oxide composite patterns 60 may include dipping the substrate 10 provided with the supporting patterns 40 into graphene-oxide-containing solution (in the step of S20). For example, as shown in FIG. 7, the substrate 10 provided with the supporting patterns 40 may be dipped into graphene-oxide-containing solution 61. The supporting patterns 40 may have insolubility, as the result of the afore-described neutralization treatment, and thus, they may not be dissolved by the graphene-oxide-containing solution. FIG. 8 is a schematic diagram illustrating a portion Q of FIG. 7.

The graphene-oxide-containing solution 61 may be prepared by dispersing a graphene oxide 62 into solvent. In example embodiments, the solvent may include at least one of water, acetic acid ($C_2H_4O_2$), acetone ($C_3H_6O$), acetonitrile ($C_2H_3N$), benzene ($C_6H_6$), 1-butanol ($C_4H_{10}O$), 2-butanol ($C_4H_{10}O$), 2-butanone ($C_4H_8O$), t-butyl alcohol ($C_4H_{10}O$), carbon tetrachloride ($CCl_4$), chlorobenzene ($C_6H_5Cl$), chloroform ($CHCl_3$), cyclohexane ($C_6H_{12}$), 1,2-dichloroethane ($C_2H_4Cl_2$), chlorobenzene, dichloromethane ($CH_2Cl_2$), ethyl ether ($C_4H_{10}O$), diethylene glycol ($C_4H_{10}O_3$), diglyme (diethylene glycol, dimethyl ether) ($C_6H_{14}O_3$), 1,2-dimethoxyethane (glyme,DME) ($C_4H_{10}O_2$), dimethylether ($C_2H_6O$), dimethyl-formamide (DMF) ($C_3H_7NO$), dimethyl sulfoxide (DMSO) ($C_2H_6OS$), dioxane ($C_4H_8O_2$), ethanol ($C_2H_6O$), ethyl acetate ($C_4H_8O_2$), ethylene glycol ($C_2H_6O_2$), glycerin ($C_3H_8O_3$), heptane ($C_7H_{16}$), hexamethylphosphoramide (HMPA) ($C_6H_{18}N_3OP$), hexamethylphosphoroustriamide (HMPT) ($C_6H_{18}N_3P$), hexane ($C_6H_{14}$), methanol ($CH_4O$), methyl t-butyl ether (MTBE) ($C_5H_{12}O$), methylene chloride ($CH_2Cl_2$), N-methyl-2-pyrrolidinone (NMP) ($CH_5H_9NO$), nitromethane ($CH_3NO_2$), pentane ($C_5H_{12}$), petroleum ether (ligroine), 1-propanol ($C_3H_8O$), 2-propanol ($C_3H_8O$), pyridine ($C_5H_5N$), tetrahydrofuran (THF) ($C_4H_8O$), Toluene ($C_7H_8$), triethyl amine ($C_6H_{15}N$), o-xylene ($C_8H_{10}$), m-xylene ($C_8H_{10}$), or p-xylene ($C_8H_{10}$).

Hydrogen chloride solution may be added into the graphene-oxide-containing solution 61 to obtain a hydrogen ion concentration (pH) of about 5 or less. The supporting patterns 40 may have a positively charged surface, and the graphene oxide 62 in the graphene-oxide-containing solution 61 may be negatively charged. The negatively charged graphene oxide 62 may be self-assembled on the positively charged surface of the supporting patterns 40, thereby forming the graphene oxide structures 63.

Figure 9A:
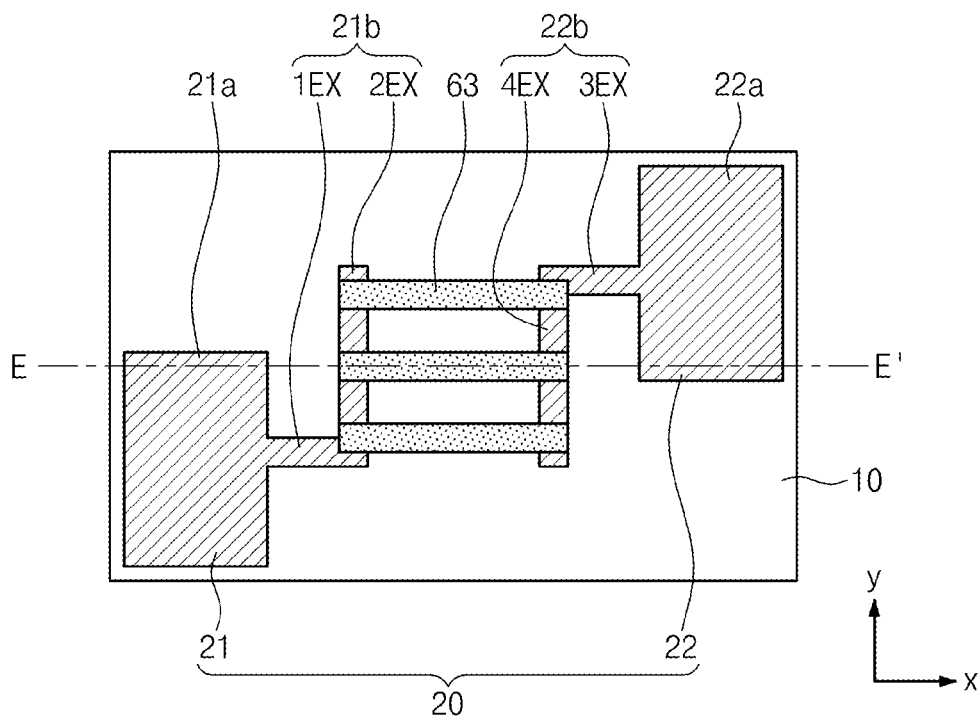
Figure 9B:
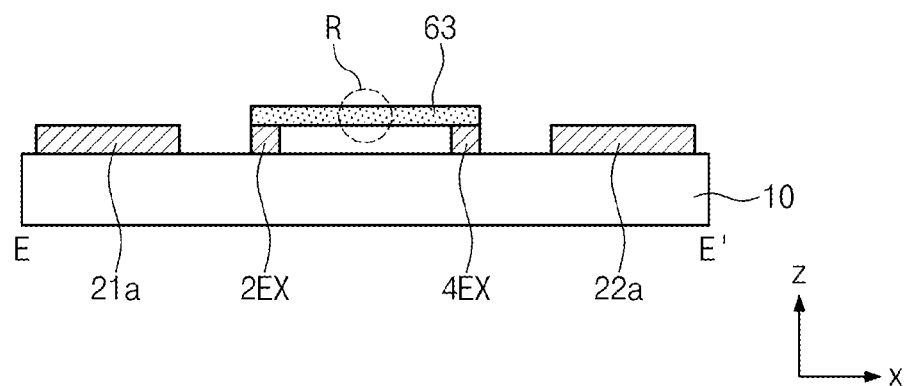
Figure 9C:
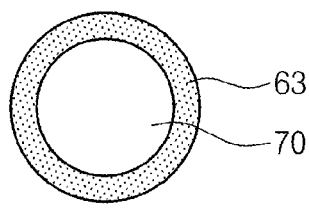
Figure 10:
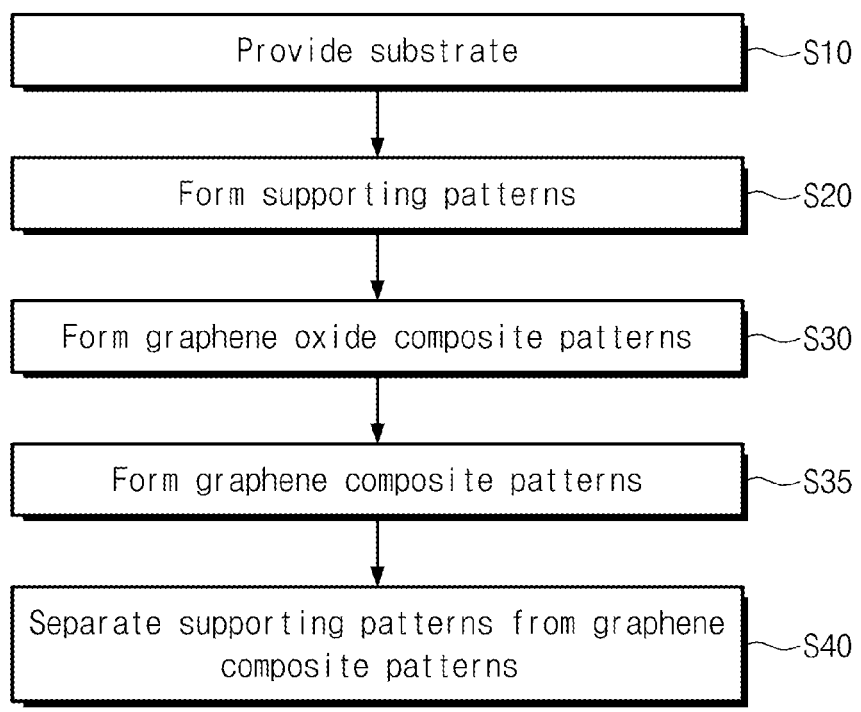
FIG. 10 is a flow chart illustrating a method of fabricating a graphene electronic device according to other example embodiments of the inventive concept.
Figure 11A:
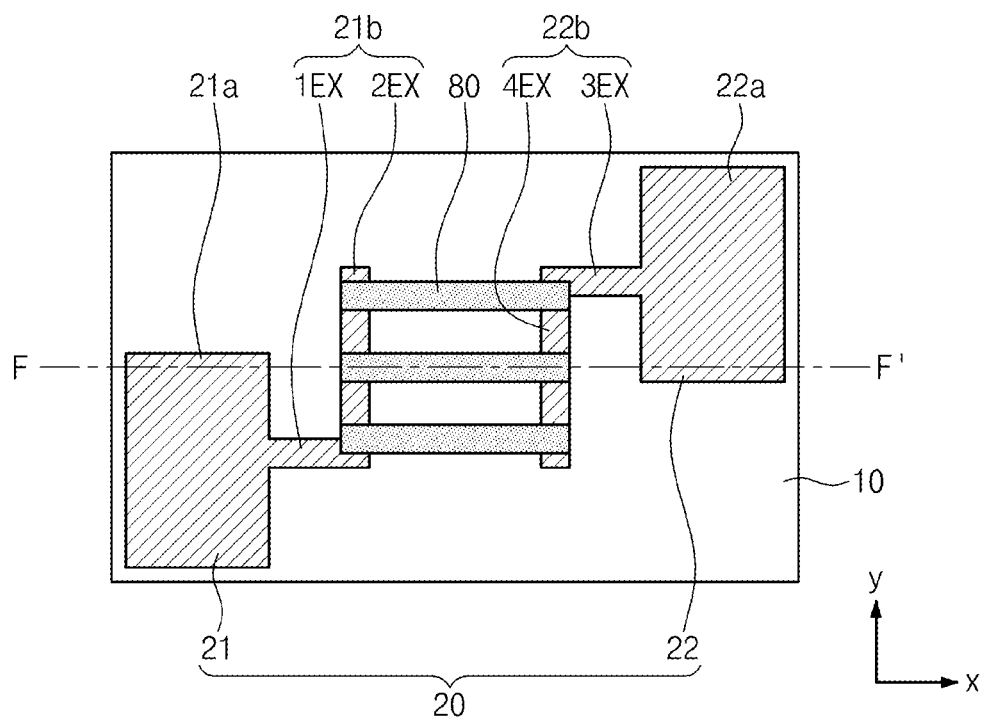
FIGS. 11A through 12C are provided to describe a graphene electronic device according to other example embodiments of the inventive concept and a method of fabricating the same.
Figure 11B:
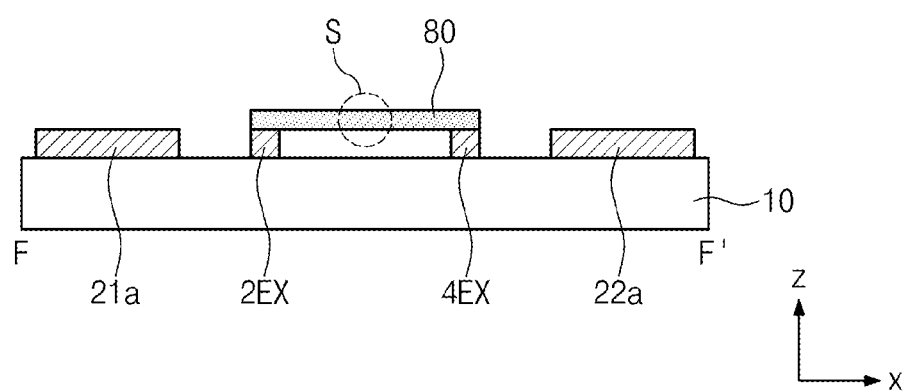
Figure 11C:
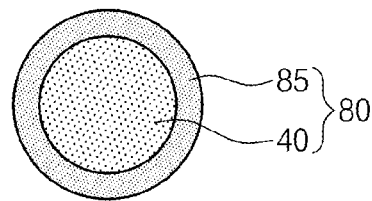

Referring to FIGS. 1 and 9A through 9C, the supporting patterns 40 may be separated from the graphene oxide composite patterns 60 (in S40). Here, FIG. 9C is a sectional view of a portion R of FIG. 9B. As the result of the removal of the supporting patterns 40, gap regions 70 that are empty spaces may be formed in the graphene oxide structures 63. The supporting patterns 40 may be separated from the graphene oxide composite patterns 60 by a thermal treatment or a chemical dissolution. For example, the electronic device with the graphene oxide composite patterns 60 may be thermally treated in a temperature ranging from about 25° C. to about 3000° C. (preferably, from about 100° C. to about 3000° C.) for about 1 minute to 24 hours. The chemical dissolution may be performed using acidic solvent, which may include at least one of acetic acid ($C_2H_4O_2$), formic acid (HCOOH), citric acid ($C_6H_8O_7$), hydrochloric acid (HCl), sulfuric acid ($H_2SO_4$), nitric acid ($HNO_3$), perchloric acid ($HClO_4$), fluoric acid (HF), phosphoric acid ($H_3PO_4$), chromic acid (HCrO4), propionic acid (CH3CH2COOH), oxalic acid, glycol acid, tartaric acid ($C_4H_5O_6$) acetone, or toluene.

The graphene electronic device with the graphene oxide structures 63 will be described in more detail with reference to FIGS. 9A through 9C. The graphene oxide structures 63 may serve as channels connecting the first electrode 21 with the second electrode 22. In example embodiments, each of the graphene oxide structures 63 may be provided to have a cylindrical structure. For example, each of the graphene oxide structures 63 may include an outer surface and an inner surface defining the gap region 70. The gap region 70 may have an internal diameter ranging from about 1 nm to about 100 μm.

Figure 12A:
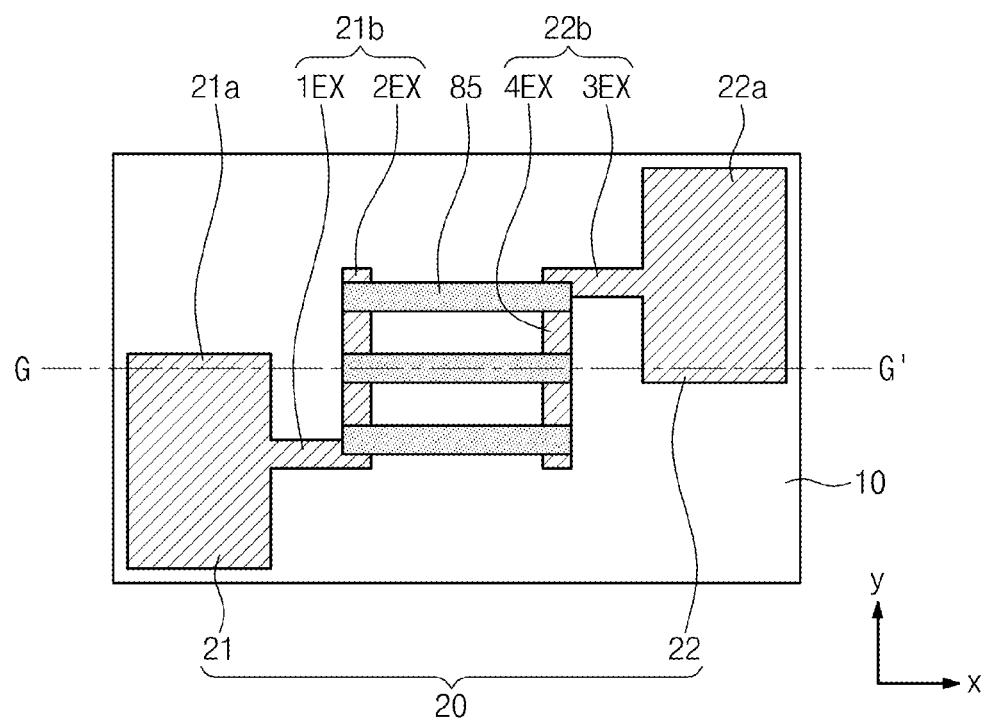
Figure 12B:
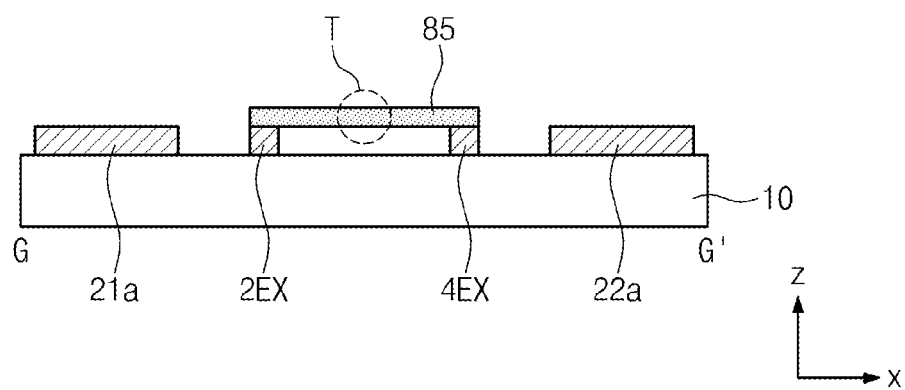
Figure 12C:
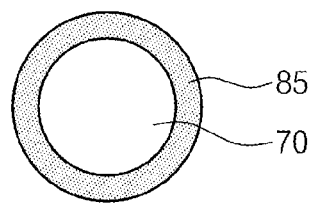

FIGS. 10 through 12C are provided to describe a graphene electronic device according to other example embodiments of the inventive concept and a method of fabricating the same. For the sake of brevity, the elements and features of this example that are similar to those previously shown and described will not be described in much further detail. FIGS. 11A and 12A are plan views illustrating the graphene electronic device according to other example embodiments of the inventive concept, and FIGS. 11B and 12B are sectional views taken along line F-F' of FIG. 11A and line G-G' of FIG. 12A. FIG. 11C is a sectional view of a portion S of FIG. 11B, and FIG. 12C is a sectional view of a portion T of FIG. 12B.

Referring to FIGS. 10 and 11A through 11C, the graphene oxide composite patterns 60 may be formed by performing the steps of S10, S20, and S30, which were described in the previous embodiments, in the substantially same manner, and graphene composite patterns 80 may be formed from the graphene oxide composite patterns 60 (in S35). Each of the graphene composite patterns 80 may include the supporting pattern 40 and a graphene structure 85 surrounding the supporting pattern 40. The graphene composite patterns 80 may be formed by performing a reduction process on the graphene oxide composite patterns 60 shown in FIGS. 6A and 6B. The reduction process may be performed using one of thermal, optical, and chemical methods. For example, the thermal reduction may be performed at a temperature of about 40° C. to about 2000° C. The optical reduction may be performed using light having wavelength of about 200 nm to about 1500 nm. The chemical reduction may be performed using at least one of hydriodic acid with acetic acid (HI—AcOH), hydrazine ($N_2H_4$), dimethyl hydrazine ($C_2H_8N_2$), sodium borohydride ($NaBH_4$), sodium hydroxide (NaOH), ascorbic acid, glucose, hydrogen sulfide ($H_2S$), hydroquinone ($C_6H_4(OH)_2$), or sulfuric acid ($H_2SO_4$).

Referring to FIGS. 10 and 12A through 12C, the supporting patterns 40 may be separated from the graphene composite patterns 80 (in S40). The supporting patterns 40 may be separated from the graphene composite patterns 80 by a thermal treatment or a chemical dissolution. The thermal treatment or the chemical dissolution may be performed in the same manner as that in the step S40 of the previous embodiments described with reference to FIG. 1.

The graphene electronic device with the graphene structures 85 will be described in more detail with reference to FIGS. FIGS. 12A through 12C. The graphene structures 85 may serve as channels connecting the first electrode 21 with the second electrode 22. For example, each of the graphene structures 85 may be provided to have a cylindrical structure. In example embodiments, each of the graphene structures 85 may include an outer surface and an inner surface defining the gap region 70. The gap region 70 may have an internal diameter ranging from about 1 nm to about 100 μm.

Hereinafter, experimental examples according to example embodiments of the inventive concept will be described to provide better understanding of example embodiments of the inventive concepts, but example embodiments of the inventive concepts may not be limited thereto.

Experimental Example 1

Using Chitosan Polymer

Using the method described in the step S10, a substrate was provided. The substrate was a silicon wafer. The substrate was cleaned by piranha solution containing hydrogen peroxide and sulfuric acid and cleaned three times by distilled water. A first electrode and a second electrode were formed on the cleaned substrate using an optical or e-beam lithography technique. The first electrode and the second electrode were formed spaced apart from each other, as shown in FIG. 2A.

Using the method described in the step S20, supporting patterns were formed on the substrate. Chitosan solution was prepared by adding chitosan powder, which was purchased from Sigma-aldrich, in trifluoroacetic acid solution and then mixing them using an agitator at 50° C. for six hours.

The substrate with the electrodes was provided on the current collector of the electrospinning apparatus described with reference to FIG. 5. A mask was provided on the electrodes to expose end portions of the first and second electrodes and the substrate between the end portions. The mask was a PCB substrate.

The prepared chitosan solution was supplied into the cylinder described with reference to FIG. 5, and thereafter, an electrospinning was performed on the current collector under an applied voltage of 15 kV and a solution injection speed of 1-5 ml/h. During the electrospinning, a distance between the cylinder and the current collector was 10 cm. Depending on the process conditions, such as a concentration of the chitosan solution and the applied voltage, chitosan fibers, i.e., supporting patterns, were formed to have a diameter ranging from several tens of nanometers to several micrometers. The electronic device with the supporting patterns was dipped into ammonia solution for four hours to neutralize it, and then, was cleaned three times by distilled water. As a result, the supporting patterns were prepared to have insolubility.

Using the method described in the step S30, graphene oxide composite patterns were formed on the substrate. Firstly, graphene-oxide-containing solution was prepared. Graphene oxide was formed by a modified Hummers and Offenman method using graphite powder (Bay carbon, SP-1 graphite). The graphene oxide powder was added in distilled water with a ratio of 0.01-1 mg/ml, and then, the solution was dispersed, for four hours, by an ultrasonic method. Thereafter, the graphene oxide solution was adjusted to have a hydrogen ion concentration (pH) of about 4.3, and then, the electronic device provided with the supporting patterns was dipped in the graphene oxide solution for five hours or more. The graphene oxide composite patterns were formed as the result of a self-assembly between an amide group formed on surfaces of the supporting patterns and an epoxy group, a hydroxyl group, and a carboxyl group of the graphene oxide. The electronic device including the graphene oxide composite patterns was cleaned three times with distilled water and was dried with nitrogen gas.

Using the method described in the step S35, the graphene oxide composite patterns were reduced to form graphene composite patterns on the substrate. The reduction was performed using hydriodic acid with acetic acid (HI—AcOH) solution. In more detail, the electronic device including graphene oxide composite patterns was dipped into and reacted with mixed solution containing 2 ml of hydriodic acid and 5 ml of acetic acid, at a temperature of 40° C. for 24 hours. As a result, the electronic device including the reduced graphene composite patterns was prepared.

Using the method described in the step S40, the supporting patterns were separated from the reduced graphene composite patterns. In more detail, the electronic device including the graphene composite patterns was thermally treated at a temperature of about 100 to 200° C. for 24 hours or dipped into acidic solvent for 30 minutes, thereby removing the chitosan fibers supporting graphene. As a result, the graphene electronic device was completed.

Experimental Example 2

Using Nylon Polymer

Using the method described in the step S10, a substrate with electrodes was provided.

Using the method described in the step S20, supporting patterns were formed on the substrate. Nylon solution was prepared by adding nylon-6 powder, which was purchased from Sigma-aldrich, in formic acid solution and then mixing them using an agitator at 50° C. for six hours.

The substrate with the electrodes was provided on the current collector of the electrospinning apparatus described with reference to FIG. 5. A mask was provided on the electrodes to expose end portions of the first and second electrodes and the substrate between the end portions.

The prepared nylon solution was supplied into the cylinder described with reference to FIG. 5, and thereafter, an electrospinning was performed on the current collector under an applied voltage of 15 kV and a solution injection speed of 0.5-5 ml/h. During the electrospinning, a distance between the cylinder and the current collector was 10 cm. Depending on the process conditions, such as a concentration of the nylon solution and the applied voltage, nylon fibers, i.e., supporting patterns, were formed to have a diameter ranging from several tens of nanometers to several micrometers. The electronic device including the supporting patterns was dried in a hood.

Using the method described in the step S30, graphene oxide composite patterns were formed in the same manner as that of the experimental example 1. Thereafter, the graphene oxide solution was adjusted to have a hydrogen ion concentration (pH) of about 4.3, and then, the electronic device provided with the supporting patterns was dipped in the graphene oxide solution for five hours or more. The graphene oxide composite patterns were formed as the result of a self-assembly between an amide group formed on surfaces of the supporting patterns and an epoxy group, a hydroxyl group, and a carboxyl group of the graphene oxide. The electronic device including the graphene oxide composite patterns was cleaned three times with distilled water and was dried with nitrogen gas.

Using the method described in the step S35, similar to the experimental example 1, the electronic device including the graphene oxide composite patterns was reduced to form the graphene composite patterns.

Using the method described in the step S40, similar to the experimental example 1, the supporting patterns of nylon were separated from the reduced graphene composite patterns. As a result, the graphene electronic device was completed.

According to example embodiments of the inventive concept, it is possible to form a graphene electronic device with a cylindrical graphene channel. In addition, a diameter of the graphene channel can be easily controlled by changing a process condition of the electrospinning process for forming the supporting patterns. Further, according to example embodiments of the inventive concept, it is possible to form the graphene electronic device on not only a rigid substrate (e.g., of silicon, glass, single crystalline wafer) but also a flexible substrate (e.g., of PDMS, PET polyimide).

According to example embodiments of the inventive concept, it is possible to fabricate a graphene electronic device with a large area graphene channel with ease.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a graphene electronic device, comprising:
    (a) forming a first electrode and a second electrode spaced apart from each other, on a substrate;
    (b) forming supporting patterns on the first electrode and the second electrode to expose end portions of the first and second electrodes and the substrate between the end portions by:
        (i.) providing a mask on the first and second electrodes; and
        (ii.) electrospinning a polymer solution on the first and second electrodes with the mask;
    (c) coating the supporting patterns with a graphene-oxide-containing solution to form composite patterns; and
    (d) separating the supporting patterns from the composite patterns.

2. The method of claim 1, wherein the supporting patterns are formed to connect the first electrode to the second electrode.

3. The method of claim 1, wherein the supporting patterns comprise polymer fibers.

4. The method of claim 1, wherein the supporting patterns are formed spaced apart from the substrate to connect the end portions of the first and second electrodes to each other.

5. The method of claim 1, wherein the forming of the supporting patterns further comprises using ammonia solution or sodium hydroxide solution to make the supporting patterns insoluble.

6. The method of claim 1, wherein the coating of the supporting patterns with a graphene-oxide-containing solution is performed in such a way that graphene oxide in the graphene-oxide-containing solution is self-assembled with the supporting patterns.

7. The method of claim 1, wherein the separating of the supporting patterns from the composite patterns comprises thermally treating or chemically dissolving an electronic device including the composite patterns.

8. The method of claim 7, wherein the chemical dissolving is performed using acidic solvent.

9. The method of claim 1, wherein the coating of the supporting patterns with a graphene-oxide-containing solution comprises:
    dipping the supporting patterns into the graphene-oxide-containing solution to form graphene oxide composite patterns; and
    reducing the graphene oxide composite patterns to graphene composite patterns.

10. The method of claim 9, wherein the reducing of the graphene oxide composite patterns to the graphene composite patterns is performed using a thermal, an optical, or a chemical method.

11. A method of fabricating a graphene electronic device, comprising:
    (a) forming a first electrode and a second electrode spaced apart from each other, on a substrate;
    (b) forming supporting patterns comprised of polymer fibers on the first electrode and the second electrode;
    (c) coating the supporting patterns with a graphene-oxide-containing solution to form composite patterns; and
    (d) separating the supporting patterns from the composite patterns.

12. The method of claim 11, wherein the supporting patterns are formed to connect the first electrode to the second electrode.

13. The method of claim 11, wherein the forming of the supporting patterns comprises:
    providing a mask on the first and second electrodes; and
    electrospinning a polymer solution on the first and second electrodes with the mask;
    wherein the mask is formed to expose the end portions of the first and second electrodes and the substrate between the end portions.

14. The method of claim 13, wherein the forming of the supporting patterns further comprises using ammonia solution or sodium hydroxide solution to make the supporting patterns insoluble.

15. The method of claim 11, wherein the supporting patterns are formed spaced apart from the substrate to connect the end portions of the first and second electrodes to each other.

16. The method of claim 11, wherein the coating of the supporting patterns with a graphene-oxide-containing solution is performed in such a way that graphene oxide in the graphene-oxide-containing solution is self-assembled with the supporting patterns.

17. The method of claim 11, wherein the separating of the supporting patterns from the composite patterns comprises thermally treating or chemically dissolving an electronic device including the composite patterns.

18. The method of claim 11, wherein each of the composite patterns is formed spaced apart from the substrate to have a cylindrical structure, the cylindrical structure comprising an outer surface and an inner surface defining an empty space.

19. The method of claim 11, wherein the coating of the supporting patterns with a graphene-oxide-containing solution comprises:
    dipping the supporting patterns into the graphene-oxide-containing solution to form graphene oxide composite patterns; and
    reducing the graphene oxide composite patterns to graphene composite patterns.

20. The method of claim 19, wherein the reducing of the graphene oxide composite patterns to the graphene composite patterns is performed using a thermal, an optical, or a chemical method.

* * * * *